United States Patent
Staehlin et al.

(10) Patent No.: US 10,068,479 B2
(45) Date of Patent: Sep. 4, 2018

(54) COMMUNICATION DEVICE FOR VEHICLE-TO-X COMMUNICATION

(71) Applicant: Continental Teves AG & Co. oHG, Frankfurt am Main (DE)

(72) Inventors: Ulrich Staehlin, Eschborn (DE); Marc Menzel, Weimar (DE)

(73) Assignee: Continental Teves AG & Co. OHG, Frankfurt (DE)

( * ) Notice: Subject to any disclaimer, the term of this patent is extended or adjusted under 35 U.S.C. 154(b) by 0 days.

(21) Appl. No.: 15/782,268

(22) Filed: Oct. 12, 2017

(65) Prior Publication Data

US 2018/0108257 A1   Apr. 19, 2018

(30) Foreign Application Priority Data

Oct. 13, 2016 (DE) .................. 10 2016 219 922
Nov. 9, 2016 (DE) .................. 10 2016 221 941

(51) Int. Cl.
| | |
|---|---|
| *G08G 1/16* | (2006.01) |
| *H04W 24/02* | (2009.01) |
| *H04B 1/3822* | (2015.01) |
| *H04W 52/16* | (2009.01) |

(52) U.S. Cl.
CPC .......... *G08G 1/163* (2013.01); *H04B 1/3822* (2013.01); *H04W 24/02* (2013.01); *H04W 52/16* (2013.01)

(58) Field of Classification Search
CPC .... H04W 24/02; H04W 52/16; H04B 1/3822; G08G 1/163
See application file for complete search history.

(56) References Cited

U.S. PATENT DOCUMENTS

| | | | |
|---|---|---|---|
| 2016/0044601 | A1 | 2/2016 | Dykyy et al. |
| 2017/0012657 | A1 | 1/2017 | Stählin et al. |

FOREIGN PATENT DOCUMENTS

| | | |
|---|---|---|
| DE | 10 2014 215 578 | 2/2016 |
| WO | 2015/121404 | 8/2015 |

OTHER PUBLICATIONS

German Search Report dated Jul. 31, 2017 for corresponding German Patent Application No. 10 2016 221 941.3.

*Primary Examiner* — Raymond Dean

(57) ABSTRACT

The invention relates to a communication device for vehicle-to-X communication for a vehicle, comprising: at least four antennas for transmitting and receiving wireless information and at least one electronic control unit (ECU) for transmitting and receiving information via the antennas and for processing the information received or to be transmitted via the antennas, wherein the at least four antennas are arranged on the vehicle in such a way that the directional characteristics of antennas among the at least four antennas which are arranged directly opposite each other on the vehicle exhibit a spatial overlap.

9 Claims, 3 Drawing Sheets

COMMUNICATION DEVICE FOR VEHICLE-TO-X COMMUNICATION

BACKGROUND

The present invention relates to a communication device for vehicle-to-X communication and its use.

Known from prior art are vehicle-to-X communication systems and vehicular ad-hoc networks according to the standards of ETSI, SAE, IEEE, which use the 5.9 GHz ISM band. In Japan a frequency range of 700 MHz is preferred when using comparable systems. These are usually one or two antenna systems which employ transmission and reception diversity to prevent interference between the signals of the two antennas. Compensators are utilised to compensate for cable attenuations in a manner known per se in the art.

A disadvantage of the known prior art is that no suitable elevated installation spaces that would facilitate a 360° radio coverage are available, in particular in types of vehicles such as convertibles or pickup trucks.

BRIEF SUMMARY

The object of the invention is therefore to provide a communication device which facilitates a 360° radio coverage in types of vehicles that do not provide suitable elevated installation spaces for antennas.

This object is accomplished by the subject matter of the independent claims. Advantageous embodiments can be found, for example, in the subclaims. The content of the claims becomes the content of the description by way of explicit reference.

The invention relates to a communication device for vehicle-to-X communication for a vehicle, comprising at least four antennas for transmitting and receiving wireless information and at least one electronic control unit for transmitting and receiving information via the antennas and for processing the information received or to be transmitted via the antennas, wherein the communication device is further distinguished by the fact that the at least four antennas are arranged on the vehicle in such a way that the directional characteristics of antennas among the at least four antennas which are arranged directly opposite each other on the vehicle preferably exhibit a spatial overlap.

In an advantageous manner it is therefore possible to achieve a 360° radio coverage even in types of vehicles which have no suitable installation space for an antenna which could cover a spatial angle larger than about 180°.

In accordance with an advantageous embodiment of the invention, the communication device is designed in such a way that antennas among the at least four antennas which are arranged diagonally opposite each other on the vehicle are provided with an identical signal. In an advantageous manner it is therefore possible to utilise e.g. an 802.11p circuit or integrated circuit (IC), also called a chip, for operation with less than four antennas while implementing a 360° radio coverage.

According to another embodiment, the directional characteristics of antennas among the at least four antennas which are arranged diagonally opposite each other on the vehicle exhibit no spatial overlap. It is therefore advantageously possible to prevent interference between the radio signals of the diagonally opposite antennas which are provided with an identical signal.

In accordance with a preferred embodiment, the antennas are provided on the vehicle in such a way that the directional characteristics of a first antenna spatially overlap with the directional characteristics of a second antenna at the front or at the rear of the vehicle and that the directional characteristics of the first antenna spatially overlap with the directional characteristics of a third antenna at a side of the vehicle.

The electronic control unit comprises at least one circuit, wherein the circuit is provided for transmitting and receiving information via at most two antennas. Currently no standard 802.11p circuits available on the market are intended to be used with more than two antennas or have both a receiving channel for operating one antenna and a transmitting channel for operating another antenna. The present invention makes it possible to utilise circuits which are intended to be used with at most two antennas with at least four antennas, thereby achieving a 360° coverage. In other words, although the circuit is intended for operation with only two antennas, the invention allows it to be used with a larger number of antennas without causing any substantial interference of the radio signals.

Preferably at least one antenna among the at least four antennas has a compensator assigned to it. This makes it advantageously possible to compensate for cable losses.

In accordance with one embodiment, the at least four antennas are each connected to the electronic control unit via connecting lines.

Preferably at least one antenna among the at least four antennas is directly connected to the electronic control unit. In this context, a direct connection is supposed to be understood as a connection that does not utilise an additional connecting line provided outside the control unit. The additional antennas, which are not directly connected to the electronic control unit, are advantageously connected to the electronic control unit via respective connecting lines external to the control unit.

In accordance with the invention, a connecting line may have a plurality of lines, for example different lines for transmitting and receiving signals.

According to a further embodiment of the communication device of the invention, at least one splitter and/or combiner is provided, wherein the splitter and/or combiner is connected to the electronic control unit and to at least one of the antennas. The connection to the antenna and/or the electronic control unit may be direct and/or indirect in this context.

In accordance with one embodiment, the at least four antennas are each connected to the splitter and/or combiner via connecting lines.

Preferably, at least one of the antennas is directly connected to the at least one splitter and/or combiner. The electronic control unit is preferably connected to the at least one splitter and/or combiner via at least one connecting line.

In addition, the at least one splitter and/or combiner can preferably be combined with the compensator.

The invention also relates to the use of at least one embodiment of the communication device according to the invention in a vehicle.

Some particularly preferable embodiments of the invention are specified in the subclaims. Other preferable embodiments, however, will emerge from the ensuing description of exemplary embodiments with reference to the figures. Embodiments of the invention can accommodate efficient contacting.

DETAILED DESCRIPTION

Figure 1:
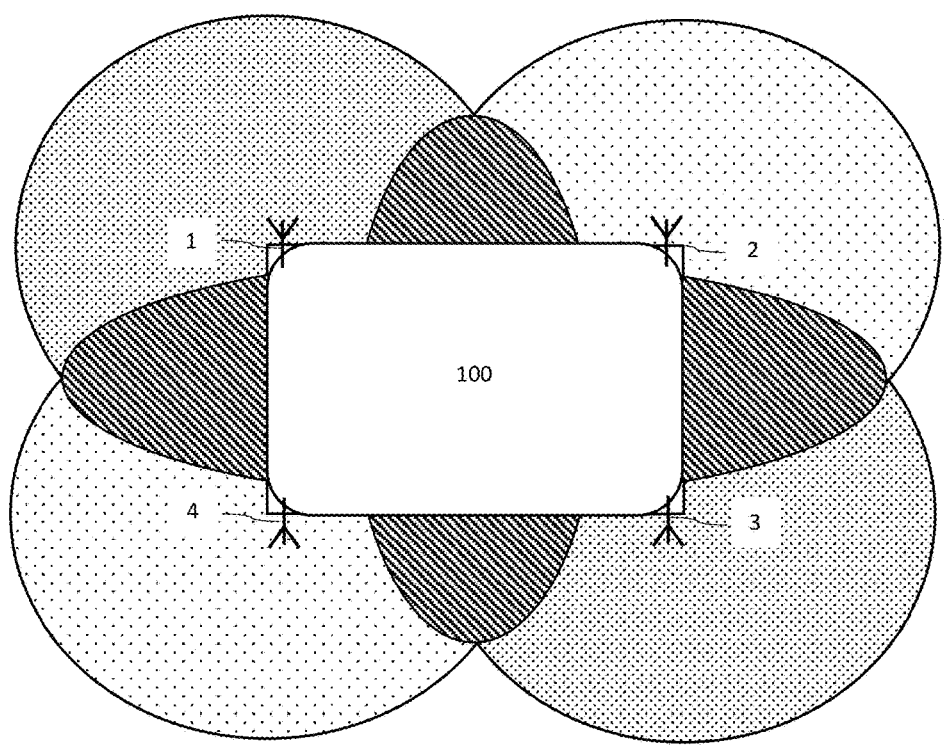
FIG. 1 an exemplary arrangement of four antennas 1, 2, 3, 4 on a vehicle 100 according to the invention, FIG. 2 to FIG. 5 circuit diagrams of preferred exemplary embodiments for linking the antennas 1 to 4 to an electronic control unit ECU and FIG. 6 a circuit diagram of a preferred exemplary embodiment of an HF component of an electronic control unit ECU in particular for use in one of the exemplary embodiments according to FIG. 2 or 3.

FIG. 1 shows an exemplary arrangement according to the invention of four antennas 1, 2, 3, 4 for vehicle-to-X communication on a vehicle 100. They are arranged in the rear and front sections of the vehicle 100 in such a way that the spatial directional characteristics or the signal propagation pattern of an antenna overlaps with the directional characteristics or the signal propagation pattern of two other antennas at the front and at the rear, respectively, and yet another antenna at a side of the vehicle such that a 360° coverage is achieved. The directional characteristics of the antennas are shown in FIG. 1 in a simplified form as circular sectors. The areas shaded with parallel lines represent the areas of overlap of the directional characteristics of antennas arranged directly opposite each other. According to the example, in other words, each of the antennas 1, 2, 3, 4 is located in the area of one of the four corners at the front and at the rear of the vehicle 100. Here the diagonally opposite antennas 2,4 and 1,3 have no overlap in their signal propagation patterns. These antennas can therefore be provided with the same signal without causing any harmful interference. This is shown in FIG. 1 by having the directional characteristics of the antennas 1 and 3 as well as 2 and 4 which are arranged diagonally opposite and not directly opposite each other filled with the same pattern. Accordingly, these identical signals can even be gained from the identical input/output signals or channels of a circuit for operating the antennas, e.g. a 802.11p chip.

Figure 2:
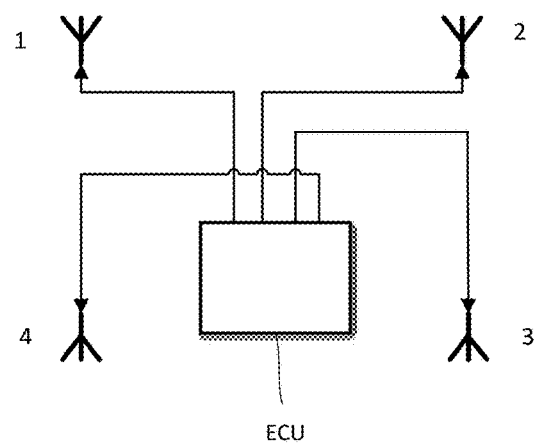

FIG. 2 shows a circuit diagram of a preferred exemplary embodiment for linking the antennas 1 to 4 to an electronic control unit ECU, wherein the electronic control unit ECU is connected to each of the antennas 1, 2, 3, 4 via one connecting line for each connection.

Figure 3:
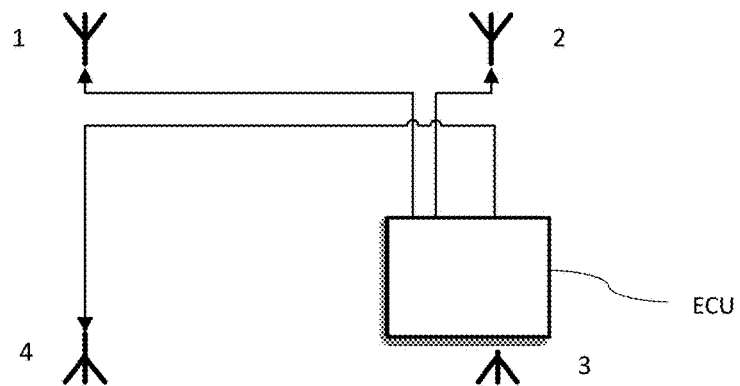

FIG. 3 shows a circuit diagram of a preferred exemplary embodiment for linking the antennas 1 to 4 to an electronic control unit ECU which differs from the embodiment according to FIG. 2 in that one antenna is in direct contact with the electronic control unit ECU and the other antennas are connected via connecting lines.

Figure 4:
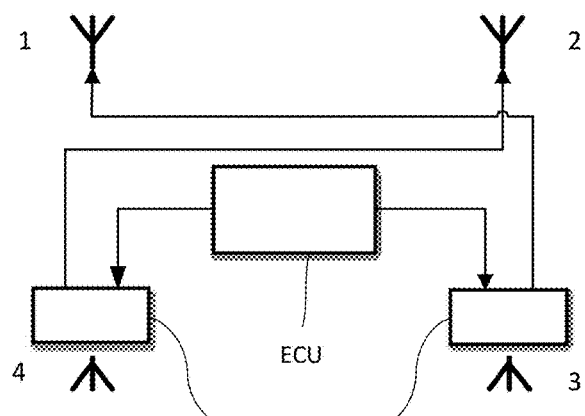

FIG. 4 shows a circuit diagram of a preferred exemplary embodiment for linking the antennas 1 to 4 to an electronic control unit ECU, wherein the electronic control unit is connected to each of the two provided external splitters and/or combiners 5,6 via one connecting line for each connection. The diagonally opposite antennas 1 and 3 are connected to the external splitter and/or combiner 6 and the diagonally opposite antennas 2 and 4 to the external splitter and/or combiner 5. Here the antennas 3 and 4 are, according to the example, directly linked to the respective splitter and/or combiner 5,6. Currently no e.g. 802.11p circuits which support more than two antennas are available. When using this embodiment, it is advantageously unnecessary to develop a special electronic control unit ECU for linking the four antennas, since the signal splitting/combining is performed by the external splitters/combiners 5,6. Preferably the external splitters/combiners 5,6 also have compensators. This embodiment allows to limit the number of different variants of the complex control unit ECU, and only the compensators, which are comparatively specific in any case, need to be adapted for the use of at least four antennas.

Figure 5:
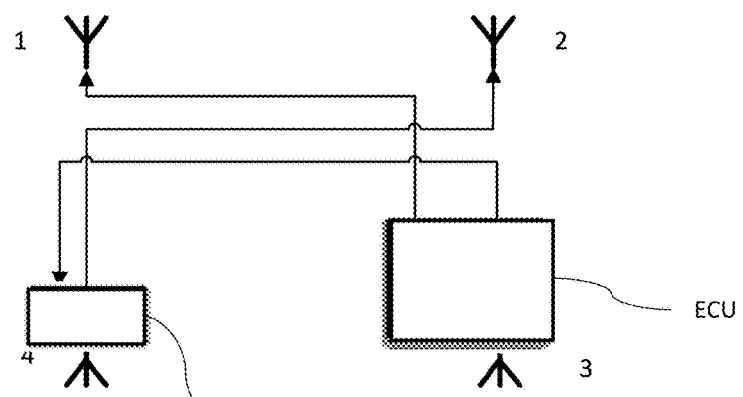

FIG. 5 shows a circuit diagram of a preferred exemplary embodiment for linking the antennas 1 to 4 to an electronic control unit ECU, wherein the electronic control unit ECU is connected via one connecting line to an external splitter and/or combiner 7 and via another connecting line to an antenna, for example antenna 1. The antenna 2 is connected to the splitter and/or combiner 5 via a connecting line. Here the antenna 3 is, according to the example, directly linked to the electronic control unit ECU and the antenna 4 is directly linked to the splitter and/or combiner 7. This embodiment makes it possible to combine the advantages of the preceding embodiments. In addition, the splitters and/or combiners can preferably be combined with the compensator.

Figure 6:
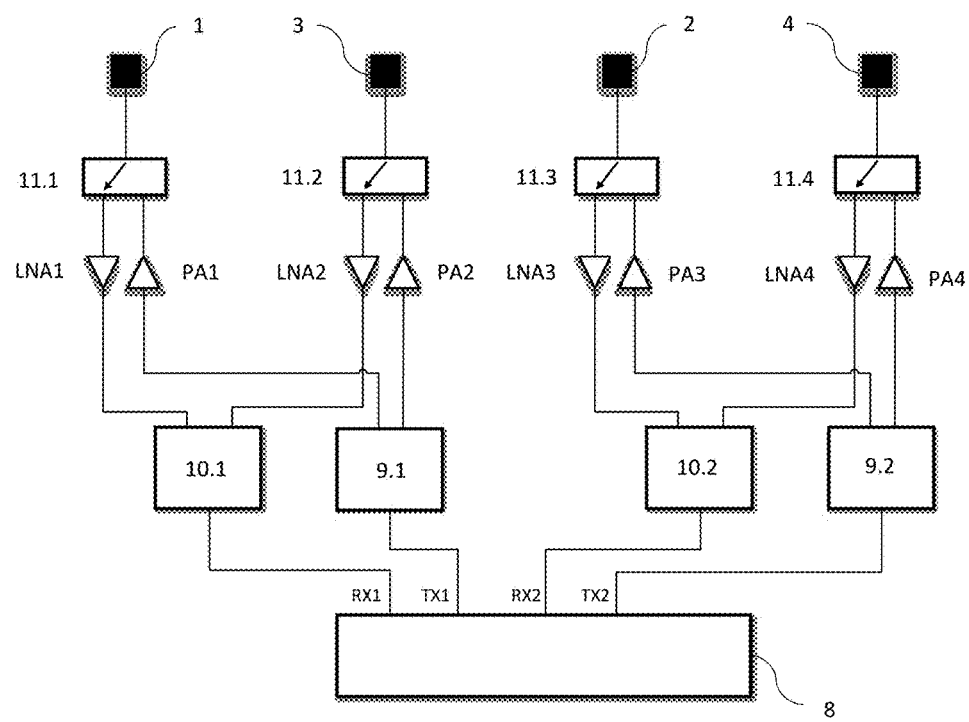

FIG. 6 shows a circuit diagram of a preferred exemplary embodiment of an HF component of an electronic control unit ECU in particular for use in one of the exemplary embodiments according to FIG. 2 or 3, but also applicable to the exemplary embodiments according to FIGS. 4 and 5. The antennas 1 and 3 are operated using a first transmitting/receiving channel RX1,TX1 and the antennas 2 and 4 using a second transmitting/receiving channel RX2,TX2 of the 802.11p circuit 8 and/or provided with the same signal. The transmit paths TX1 and TX2 comprise respective splitters 9.1,9.2 for providing the signal provided by the respective output TX1,TX2 of the circuit 8 to the antennas 1 to 4 and respective combiners 10.1,10.2 for combining the signals received via the respective antennas 1 and 3 and the respective antennas 2 and 4 and for providing these signals to the respective input RX1,RX2 of the circuit 8. Further provided in each antenna path are switches 11.1 to 11.4, e.g. circulators, which are known per se in the art, for switching the antenna to the receive path or the transmit path.

According to the example, low-noise amplifiers LNA1 to LNA4 are provided in the respective receive path and amplifiers PA1 to PA4, all of which are known per se in the art, in the respective transmit path of the antennas.

The splitters can be implemented e.g. as Wilkinson dividers or as microstrip directional couplers. The same applies to the combiners, but there the differential mode portions of the signals cancel each other out, which is acceptable in the case of independent signal sources.

If in the course of the procedure it transpires that a feature or a group of features is not absolutely necessary, the applicant shall now already strive to formulate at least one independent claim that does no longer have that feature or that group of features. This could be, for example, a partial combination of a claim presented on the date of filing or a partial combination of a claim presented on the date of filing that has been limited by additional features. Such claims or combinations of features which shall be newly formulated are to be understood as covered by the disclosure of this application as well.

It should also be pointed out that configurations, features and variations of the invention which are described in the different embodiments or exemplary embodiments and/or shown in the figures can be used in any combination. Individual features or groups of features are mutually interchangeable. Combinations of features resulting therefrom are to be understood as covered by the disclosure of this application as well.

If dependent claims refer to preceding claims that is not to be understood as a renouncement of the attainment of independent protection of the subject matter for the features of the subclaims referring to preceding claims. These features can also be arbitrarily combined with other features.

Features which are merely disclosed in the description or features which are disclosed in the description or in a claim only in combination with other features can in principle have an independent relevance essential for the invention. They can therefore also be included individually in the claims in order to delimit the subject matter claimed from the prior art.

It must be pointed out in general that a vehicle-to-X communication is to be understood in particular as a direct communication between vehicles and/or between vehicles and infrastructural facilities. It could thus be, for example, a vehicle-to-vehicle communication or a vehicle-to-infrastructure communication. Insofar as a communication between vehicles is referred to in the context of this application, such communication can take place in principle in the context of, for example, a vehicle-to-vehicle communication which typically occurs without being relayed through a mobile phone network or a similar external infrastructure and which therefore must be differentiated from other solutions which, for example, are based on a mobile phone network. For example, a vehicle-to-X communication can take place using the IEEE 802.11p or IEEE 1609.4 standards. A vehicle-to-X communication can also be called a C2X communication. Its subdivisions can be called C2C (car-to-car) or C2I (car-to-infrastructure). However, the invention explicitly does not exclude the possibility of vehicle-to-X communication which is relayed, for example, through a mobile phone network.

The invention claimed is:

1. A communication device for vehicle-to-X communication for a vehicle, comprising
    at least four antennas for transmitting and receiving wireless information and
    at least one electronic control unit (ECU) for transmitting and receiving information via the antennas and for processing the information received or to be transmitted via the antennas,
    wherein the at least four antennas are arranged on the vehicle in such a way that the directional characteristics of antennas among the at least four antennas which are arranged directly opposite each other on the vehicle exhibit a spatial overlap.

2. The communication device according to claim 1, characterized in that the communication device is designed in such a way that a first pair of antennas of the at least four antennas are arranged diagonally opposite each other on the vehicle and are provided with an identical first signal, and a second pair of antennas of the at least four antennas are arranged diagonally opposite each other on the vehicle and are provided with an identical second signal.

3. The communication device according to claim 1, characterized in that the directional characteristics of antennas among the at least four antennas which are arranged diagonally opposite each other on the vehicle exhibit no spatial overlap.

4. The communication device according to claim 1, characterized in that the directional characteristics of a first antenna spatially overlap with the directional characteristics of a second antenna at the front or at the rear of the vehicle and in that the directional characteristics of the first antenna spatially overlap with the directional characteristics of a third antenna at a side of the vehicle.

5. The communication device according to claim 1, characterized in that the electronic control unit (ECU) comprises at least one circuit, wherein the circuit is provided for transmitting and receiving information via at most two antennas.

6. The communication device according to claim 1, characterized in that at least one antenna among the at least four antennas has a compensator assigned to it.

7. The communication device according to claim 1, characterized in that the at least four antennas are each connected to the electronic control unit (ECU) via connecting lines or in that at least one antenna among the at least four antennas is directly connected to the electronic control unit (ECU) and at least one further antenna among the at least four antennas is connected to the electronic control unit (ECU) via a connecting line.

8. The communication device according to claim 1, characterized in that at least one splitter and/or combiner is provided, wherein the splitter and/or combiner is connected to the electronic control unit (ECU) and to at least one of the antennas.

9. The communication device according to claim 8, characterized in that the at least four antennas are each connected to the at least one splitter and/or combiner via connecting lines or in that at least one of the antennas is directly connected to the at least one splitter and/or combiner.

* * * * *